(12) United States Patent
Pal

(10) Patent No.: US 9,613,892 B2
(45) Date of Patent: Apr. 4, 2017

(54) SOLID STATE CONTACTOR WITH IMPROVED INTERCONNECT STRUCTURE

(71) Applicant: Goodrich Corporation, Charlotte, NC (US)

(72) Inventor: Debabrata Pal, Hoffman Estates, IL (US)

(73) Assignee: Hamilton Sundstrand Corporation, Charlotte, NC (US)

(*) Notice: Subject to any disclaimer, the term of this patent is extended or adjusted under 35 U.S.C. 154(b) by 197 days.

(21) Appl. No.: 14/529,192

(22) Filed: Oct. 31, 2014

(65) Prior Publication Data

US 2016/0126170 A1   May 5, 2016

(51) Int. Cl.

| H01L 23/49 | (2006.01) |
| H01L 23/50 | (2006.01) |
| H01L 23/498 | (2006.01) |
| H01L 23/00 | (2006.01) |
| H05K 1/02 | (2006.01) |
| H05K 1/18 | (2006.01) |

(52) U.S. Cl.
CPC ........ H01L 23/49811 (2013.01); H01L 23/50 (2013.01); H01L 24/00 (2013.01); H05K 1/0265 (2013.01); H05K 1/0203 (2013.01); H05K 1/181 (2013.01); H05K 2201/10166 (2013.01); H05K 2201/10272 (2013.01)

(58) Field of Classification Search
CPC . H01L 23/498; H01L 23/50; H01L 23/49811; H01L 24/00
USPC ........................................................ 361/783
See application file for complete search history.

(56) References Cited

U.S. PATENT DOCUMENTS

| 5,426,263 | A | 6/1995 | Potter et al. |
| 5,877,538 | A | 3/1999 | Williams |
| 6,096,608 | A | 8/2000 | Williams |
| 6,396,102 | B1 | 5/2002 | Calafut |
| 6,456,515 | B1* | 9/2002 | Rose, Sr. .............. H02M 7/003 363/141 |
| 6,673,680 | B2 | 1/2004 | Calafut |
| 6,861,701 | B2 | 3/2005 | Williams et al. |
| 6,946,740 | B2 | 9/2005 | Schaffer |
| 2001/0033477 | A1* | 10/2001 | Inoue .................. H01L 23/4006 361/718 |
| 2003/0063161 | A1* | 4/2003 | Dodd ................... B41J 2/14072 347/58 |
| 2003/0137813 | A1 | 7/2003 | Onizuka et al. |

(Continued)

OTHER PUBLICATIONS

European Search Report for European Application No. 15192308.3 completed Mar. 31, 2016.

(Continued)

*Primary Examiner* — Eric Thomas
*Assistant Examiner* — Michael P McFadden
(74) *Attorney, Agent, or Firm* — Carlson, Gaskey & Olds, PC

(57) ABSTRACT

A printed circuit board for selectively communicating power from a power source to a use has an input bus for receiving a power supply. A transistor is connected to the input bus and is positioned on one side of the input bus in a first direction. An output bus is connected to the transistor on an opposed side of the transistor relative to the input bus. The transistor is intermediate at the first input and output buses in the first dimension. A power supply system is also disclosed.

9 Claims, 2 Drawing Sheets

(56) References Cited

U.S. PATENT DOCUMENTS

Figure 1:
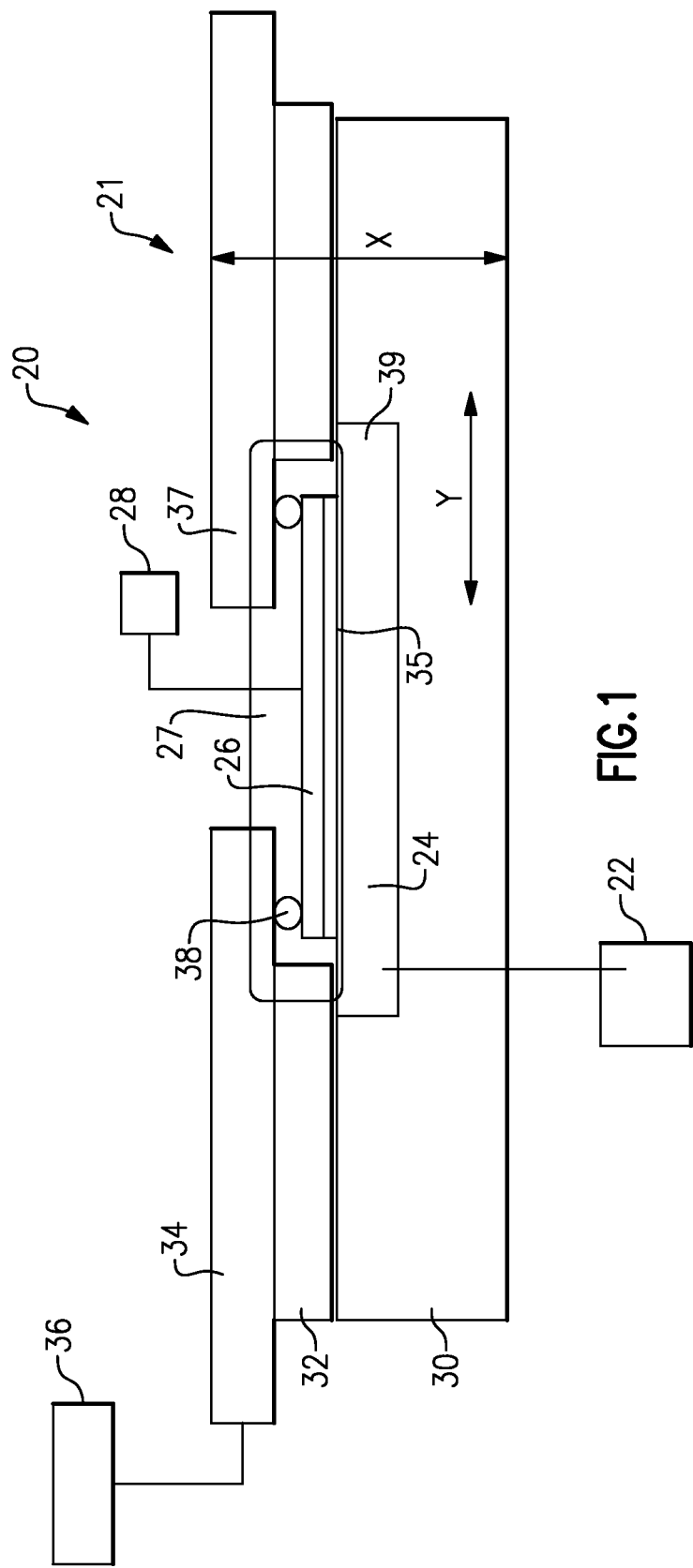
Figure 2:
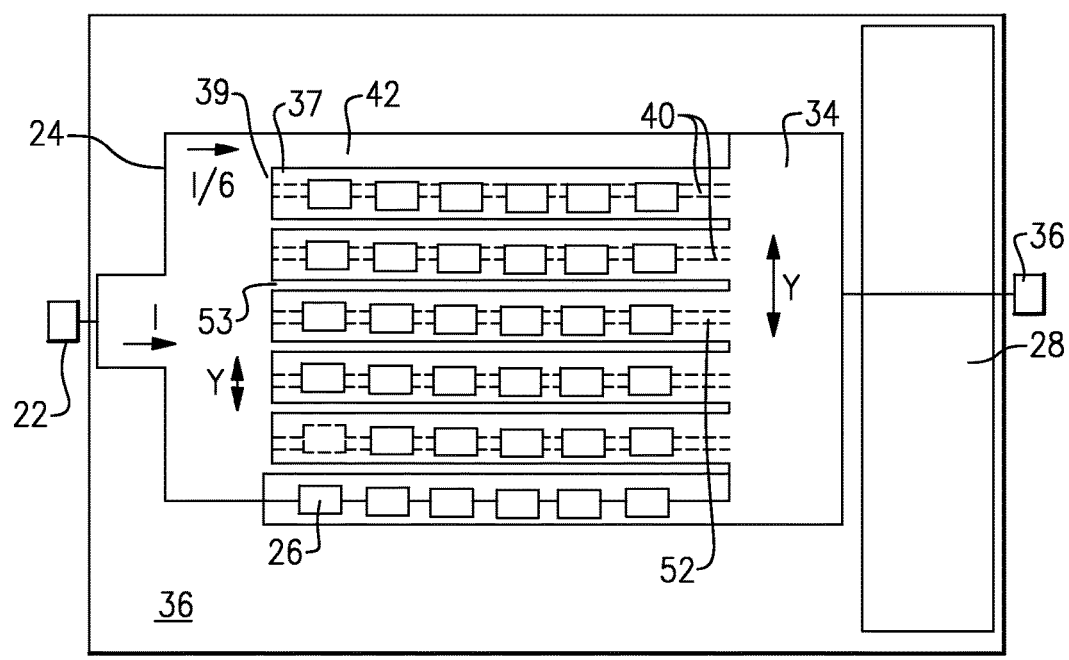

2004/0119148 A1   6/2004  Standing
2013/0039544 A1*  2/2013  Robert ............... G06K 9/00791
                                                              382/104

OTHER PUBLICATIONS

"Design with MOSFET Load Switch," Alan Li, John Bendel, Fairchild Semiconductor, Oct. 1998.

* cited by examiner

SOLID STATE CONTACTOR WITH IMPROVED INTERCONNECT STRUCTURE

BACKGROUND OF THE INVENTION

This application relates to an improved printed wiring board for communicating a power supply to a use.

The control of electronic components is becoming increasingly sophisticated. One common application is a printed wiring board which includes a power supply communicating power through an input bus. A plurality of switches, typically transistors, and in many cases, metal oxide semiconductor field-effect transistors (MOSFETs) communicate the input bus to an output bus. A control board controls operation of a plurality of MOSFETs to selectively transmit power from a power source to various uses.

There are a plurality of such boards utilized on most aircraft, and also in other aerospace applications.

In the known art, the input bus and the output bus have been positioned in a common plane. The MOSFETs are mounted on one of the buses, and connected to the other by wires. This has required a relatively large amount of space between fingers on the input and output buses, and has thus resulted in the overall arrangement being undesirably large.

SUMMARY OF THE INVENTION

A printed circuit board for selectively communicating power from a power source to a use has an input bus for receiving a power supply. A transistor is connected to the input bus and is positioned on one side of the input bus in a first direction. An output bus is connected to the transistor on an opposed side of the transistor relative to the input bus. The transistor is intermediate at the first input and output buses in the first dimension. A power supply system is also disclosed.

These and other features may be best understood from the following drawings and specification.

BRIEF DESCRIPTION OF THE DRAWINGS

FIG. 1 is a side view of a power supply system.

FIG. 2 is a top view of the system.

DETAILED DESCRIPTION

FIG. 1 shows a power supply system 20 incorporating a printed wiring board 21. A power supply 22 selectively provides power to an input bus 24. It should be noted that FIG. 1 shows only one portion of the wiring board 21, and the wiring board would actually have a plurality of the structure shown in FIG. 1, and as perhaps better shown in FIG. 2. The input bus 24 is connected to a transistor 26 which may be a MOSFET. An encapsulant 27 encloses the area around the MOSFET 26. A controller 28 controls the transistor 26. A body 30 mounts all of the structure.

It should be understood that control circuitry 28 (See FIG. 2) is incorporated somewhere within the body 30. A spacer 32 may be formed of AlN or $Al_2O_3$ or other appropriate materials. Spacer 32 separates an output bus 34 from the body 30. A die attachment 35 may connect the transistor 26 to the input bus 24. The output bus 34 communicates with a use 36, which may be a use on an aerospace application.

In fact, the overall system such as shown in FIG. 2 may have a plurality of transistors (or MOSFETs) 26, and could communicate with a plurality of uses.

The operation of the control circuit and when it would be desirable to transfer power is known in the art. It is the architecture of the printed wiring board 21 which is novel to this disclosure.

As can be appreciated, the printed wiring board 21 extends along a dimension X and along a dimension Y in the illustrated plane. In the prior art, the buses 24 and 34 would be co-planer in the dimension X. In the prior art, MOSFETs are electrically connected to the bus bars by wire-bonds. However, as can be seen, they are spaced within the X plane in this disclosure. They also overlap within the dimension Y, which is perpendicular to the dimension X. That is, a portion 37 of the output bus 34 is positioned on an opposed side of a solder joint 38 connecting the transistor 26 to the bus 34 relative to the input bus 24. The transistor 26 is, thus, also positioned intermediate the portions 37 and a portion 39 of the input bus 24 on an opposed side of the solder joint 38 and transistor 26. For each MOSFET connection to the bus bar, there will be multiple solder joints such as greater than two and as many as eight or more.

FIG. 2 is a view generally looking downwardly on FIG. 1. It should be understood that FIG. 1 only illustrates a portion of FIG. 2. As can be seen, input bus 24 actually has a plurality of fingers 42 which are interspersed with fingers 40 from the output bus 34. The portions 39 and 37 overlap in the Y dimension, which is perpendicular to the X dimension. Spaces 52 exist between fingers 42 and beneath finger 40. Similar spaces 53 between fingers 40 are above a finger 42. That is, fingers 40/42 span spaces 52/53. With this arrangement, the density of components within the printed circuit board is increased and the overall size can be decreased. As can also be seen, the fingers 42 are spaced from each other in the Y dimension, and the fingers 40 are also spaced from each other in the Y dimension.

The disclosure could be summarized as describing a printed circuit board 21 that selectively communicates power from a power source 22 to a use 36. An input bus 24 receives the power supply from source 22. A transistor 26 is connected to input bus 24 and positioned on one side of the input bus in a first direction. An output bus 34 is connected to transistor 26 on an opposed side of the transistor 26 relative to input bus 24. Thus, transistor 26 is intermediate the input and output buses in the first dimension. Due to direct solder interconnect, spacing between the bus bars can be reduced. This results in reduction of bus bar width for a given current. Due to direct solder interconnect, more bus bars can be packaged. This reduces heat load. This improves thermal design. For example, current flow per bus bar can be reduced by 33% compared to a prior art printed wiring board.

Although an embodiment of this invention has been disclosed, a worker of ordinary skill in this art would recognize that certain modifications would come within the scope of this invention. For that reason, the following claims should be studied to determine the true scope and content of this invention.

The invention claimed is:

1. A printed circuit board for selectively communicating power from a power source to a use comprising:

an input bus for receiving a power supply;

a transistor connected to said input bus and positioned on one side of said input bus in a first dimension;

an output bus connected to said transistor on an opposed side of said transistor relative to said input bus, such that said transistor is intermediate said input and output buses in said first dimension, and said input and output buses having portions overlapping each other in a second dimension which is perpendicular to said first dimension; and each of said input and output buses include a plurality of fingers with said fingers having portions overlapping each other in said second dimension and other portions which overlap a space between the fingers of the other of said input and output buses, the fingers on said input bus being spaced from each other in said second dimension, and the fingers on said output bus being spaced from each other in said second dimension.

2. The printed circuit board as set forth in claim 1, wherein a die attachment is utilized to connect said transistor to one of said input and output buses and a solder joint is utilized to connect the transistor to the other.

3. The printed circuit board as set forth in claim 1, wherein a spacer is positioned between said output bus and said printed circuit board.

4. The printed circuit board as set forth in claim 1, wherein said transistor is a MOSFET.

5. A power supply system comprising:
a source of power, a printed circuit board for controlling the supply of power from said power source to a use, said printed circuit board including an input bus for receiving power from said power supply;
a transistor connected to said input bus, and positioned on one side of said input bus in a first dimension;
an output bus connected to said transistor on an opposed side of said transistor relative to said input bus, such that said transistor is intermediate said input and output buses in said first dimension, and said input and output buses having portions overlapping each other in a second dimension which is perpendicular to said first dimension; and each of said input and output buses include a plurality of fingers with said fingers having portions overlapping each other in said second dimension and other portions which overlap a space between the fingers of the other of said input and output buses, the fingers on said input bus being spaced from each other in said second dimension, and the fingers on said output bus being spaced from each other in said second dimension.

6. The power supply system as set forth in claim 5, wherein a die attachment is utilized to connect said transistor to one of said input and output buses and a solder joint is utilized to connect the transistor to the other.

7. The power supply system as set forth in claim 5, wherein a spacer is positioned between said output bus and said wiring board.

8. The power supply system as set forth in claim 5, wherein said use is in an aerospace application.

9. The power supply system as set forth in claim 5, wherein said transistor is a MOSFET.

* * * * *